United States Patent [19]

Isoda et al.

[11] Patent Number: 4,878,056
[45] Date of Patent: Oct. 31, 1989

[54] KEY INPUT CIRCUIT

[75] Inventors: Noriyuki Isoda; Yuji Okamoto, both of Sagamihara, Japan

[73] Assignee: Topre Corporation, Tokyo, Japan

[21] Appl. No.: 84,191

[22] Filed: Aug. 12, 1987

[30] Foreign Application Priority Data

Oct. 29, 1986 [JP] Japan .................. 61-255780

[51] Int. Cl.[4] .................................. G06F 3/00
[52] U.S. Cl. ........................ 341/26; 341/25
[58] Field of Search .......... 364/900 MS File; 340/825.11, 825.79; 370/68.1; 341/26, 25

[56] References Cited

U.S. PATENT DOCUMENTS

| | | | |
|---|---|---|---|
| 3,613,054 | 10/1971 | Ricard | 364/900 |
| 3,706,973 | 12/1972 | Acquadro et al. | 364/900 |
| 4,040,036 | 8/1977 | Hester | 364/900 |
| 4,079,234 | 3/1978 | Kashio | 364/900 |
| 4,303,907 | 12/1981 | Wilson | 340/825.79 |
| 4,318,087 | 2/1982 | Wilson | 341/26 |
| 4,360,913 | 11/1982 | Struger et al. | 364/900 |
| 4,485,455 | 11/1984 | Boone et al. | 364/900 |
| 4,513,394 | 4/1985 | Deyer | 364/900 |
| 4,538,027 | 8/1985 | Deyer | 178/22.01 |

OTHER PUBLICATIONS

The TTL Data Book ©1985, pp. 3-493 to 3-497 and 3-1055 to 3-1063, Texas Instruments.
"An Introduction to Digital and Analog Integrated Circuits and Applications, " by Sanjit Mitra, Harper & Row Publishers, ©1980, pp. 75-82, 87-88, 466.

Primary Examiner—Parshotam S. Lall
Assistant Examiner—S. A. Melnick
Attorney, Agent, or Firm—Oblon, Spivak, McClelland, Maier & Neustadt

[57] ABSTRACT

A plurality of key switches are provided, each of which is connected, at one end, to the ground, and at the other end, to a power supply, by means of a resistor. The key switches are coupled, at the connection point with the resistor, to input buffers. Each input buffer outputs an electrical signal when the corresponding key switch is turned on. A counter circuit is provided for counting clock signals supplied from a CPU at predetermined intervals. The output data of this counter circuit is supplied to selectors, which select one of the input buffers, in accordance with the output data of the counter circuit, and supply the output signal of the selected input buffer to the CPU.

17 Claims, 6 Drawing Sheets

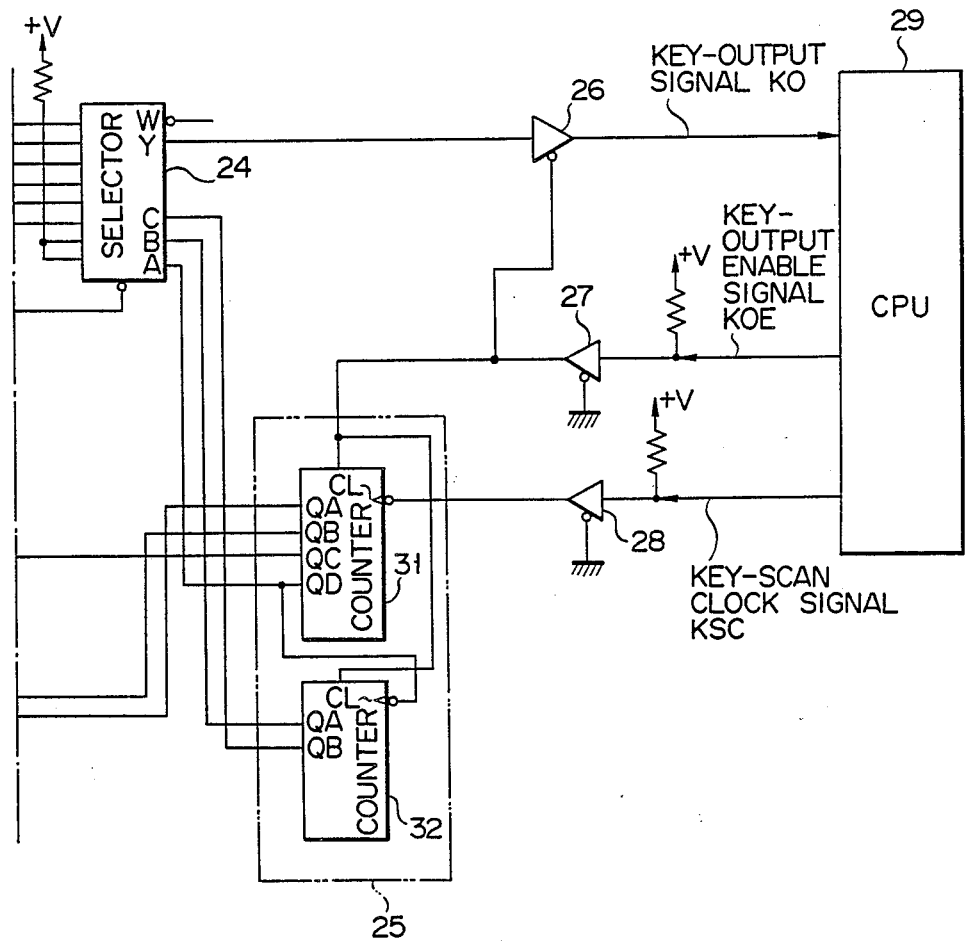
F I G. 1B

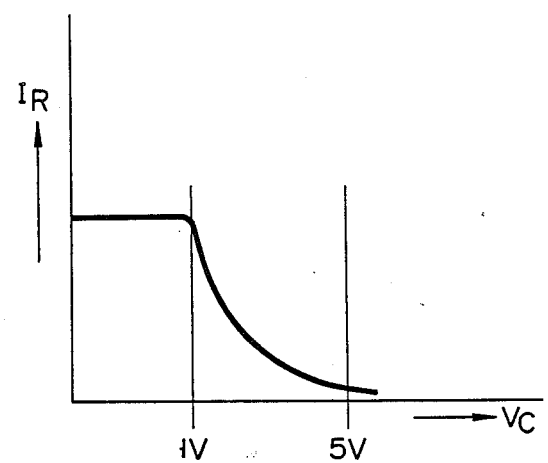
F I G. 8
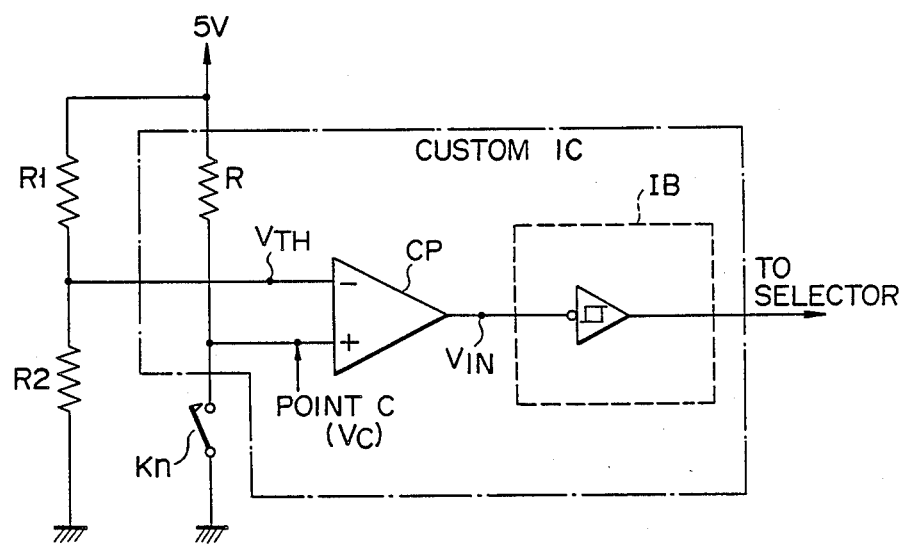
F I G. 9

KEY INPUT CIRCUIT

BACKGROUND OF THE INVENTION

The present invention relates to a key input circuit for use in a keyboard, and particularly, to a key input circuit for outputting signals as the keys of a keyboard are operated.

Keyboards used as input devices for information-processing apparatuses, such as computers, are known. Each of these keyboards features a key input circuit which has a number of keys arranged substantially in a given plane, and which are assigned to characters such as letters, numerals, and symbols. As the keys are selectively operated, the key input circuit generates and supplies coded signals, corresponding to the characters, to the information-processing apparatus. This type of input circuit generally has key switches which have mechanical contacts.

A key input circuit of this type is known which comprises 16 drive lines, M sense lines, and key switches. The drive lines are parallel to each other, and extend at right angles to the sense lines, which are also parallel to each other. The key switches are provided at the intersections of the drive lines and the sense lines. Hence, this key input circuit is a matrix circuit. Each drive line is connected, at one end, to a power supply by a resistor, and at the other end, to a drive circuit. Each sense line is connected, at one end, to the power supply by a resistor, and at the other end, to an input buffer.

When two or more adjacent key switches are depressed simultaneously, a few other keys located close to these depressed ones go into a turned-on condition, thus generating character code signals, or else character code signals corresponding to none of the key switches are output from the key input circuit. The code signals generated by the undepressed key switches, and those corresponding to none of the key switches, are called "ghost character signals."

In order to prevent the generation of such ghost character signals, it has been proposed that a diode be coupled to the contact of each key switch. If this proposal is adopted, the key input circuit would require as many diodes as there are key switches, with the result that the switch section and circuit board of the key input circuit would inevitably become complex.

Let us think of an equivalent circuit of each key switch used in this key input circuit. In the equivalent circuit, a drive line coupled to the drive circuit is connected to the cathode of the diode. The anode of the diode is coupled to one end of the key switch. The other end of the key switch is connected by a resistor to the power supply. A sense line coupled to the input buffer is connected to the connection point of the key switch and the resistor.

With this key input circuit, in order to convert the contact signal of each key switch to an electrical signal, the input buffer must recognize that a signal at the logic "0" level is on the sense line coupled to this key switch, when the key switch is turned on. Let us assume that the drive circuit is SN74LS145, and the input buffer is SN74HC541. In this case, maximum voltage $V_{iL}$(max) at which the input buffer can recognize logic "0" is 1.2 volts. Hence, unless the potential at the connection point of the key switch and the resistor is 1.2 volts or less, the input buffer cannot recognize logic "0", even if the key switch is turned on.

When the drive circuit sets the drive line coupled to the key switch to the logic level "0", the potential at the connection point of the drive circuit and the diode is 0.25 volts, since the reference voltage $V_{OL}$ for the logic "0" of drive circuit is 0.25 volts. When the forward voltage $V_F$ of the diode is 0.7 volts, the potential applied between the connection point of the drive circuit and the diode and the connection point of the key switch and the diode is 0.7 volts. Thus, the potential applied between the key switch and the diode can be given as:

$$0.25 + 0.7 = 0.95 \text{ (V)}$$

Therefore, the margin between this potential and the sense potential of the key switch, which is 1.2 volts, is:

$$1.2 - 0.95 = 0.25 \text{ (V)}$$

Due to this relatively small margin, the potential between the key switch and the diode may increase above 1.2 volts under the influence of conditional changes, such as a higher temperature, resulting in the changes in $V_{OL}$ and $V_F$, and due to the fact that $V_{OL}$ and $V_F$ are different from the design values. Therefore, the key input circuit of this structure is not sufficiently reliable.

In order that the input buffer correctly recognize logic "0" when any key switch is turned on, the maximum voltage drop, $V_{RS}$(max), resulting from the contact resistance Rs of the key switch, must be equal to or less than:

$$1.2 - 0.95 = 0.25 \text{ (V)}$$

When the key input circuit is manufactured, each key switch has such contact resistance that maximum voltage drop $V_{RS}$(max) is less than 0.25 volts. As the key switch is repeatedly turned on and off, however, its contact resistance gradually increases. The voltage drop at the key switch will rise above 0.25 volts after a comparatively short period of use (e.g., after the switch has been turned on and off about 5,000,000 times). If this is the case, the input buffer can no longer recognize logic "0" when the key switch is turned on. At this point, the key switch is considered to have reached the end of its useful life. Thus, the key switches of the key input circuit have a relatively short useful life.

The maximum value, Rs(max), of contact resistance Rs of the key switch can be given as follows:

$$\frac{Rs(\max)}{Rs(\max) + R} \times (5 - 0.95) = (1.2 - 0.95)(V)$$

Where, R is the resistance value of the resistor connected between the key switch and the power supply. Thus, $$Rs(\max) = 0.65R (\Omega)$$

Consequently, key switches having a contact resistance over 0.065R cannot be used in the conventional key input circuit of the structure described above.

SUMMARY OF THE INVENTION

It is accordingly the object of the present invention to provide a key input circuit wherein key switches can be used for a long period of time.

Another object of this invention is to provide a key input circuit which can extend the useful life of the key switches used in it, and which has a simple structure and is highly reliable.

A key input circuit according to the present invention comprises: a plurality of key switches; a plurality of signal-output means connected to the key switches, for outputting electrical signals when the key switches are turned on; counter means for receiving and counting clock signals supplied at predetermined intervals; and scanning means for receiving output data from the counter means, and scanning the signal-output means in accordance with the output data of the counter means, thereby to output the above-mentioned electrical signals.

BRIEF DESCRIPTION OF THE DRAWINGS

FIGS. 1A and 1B illustrate a key input circuit according to one embodiment of the present invention;

FIG. 8 is a graph illustrating the electrical characteristics of the FETs used in the circuit of FIG. 7; and FIG. 9 is an equivalent circuit diagram showing each of the key switches used in a further embodiment of the present invention.

DETAILED DESCRIPTION OF THE PREFERRED EMBODIMENTS

An embodiment of the present invention will now be described, with reference to the accompanying drawings.

Figure 1A:
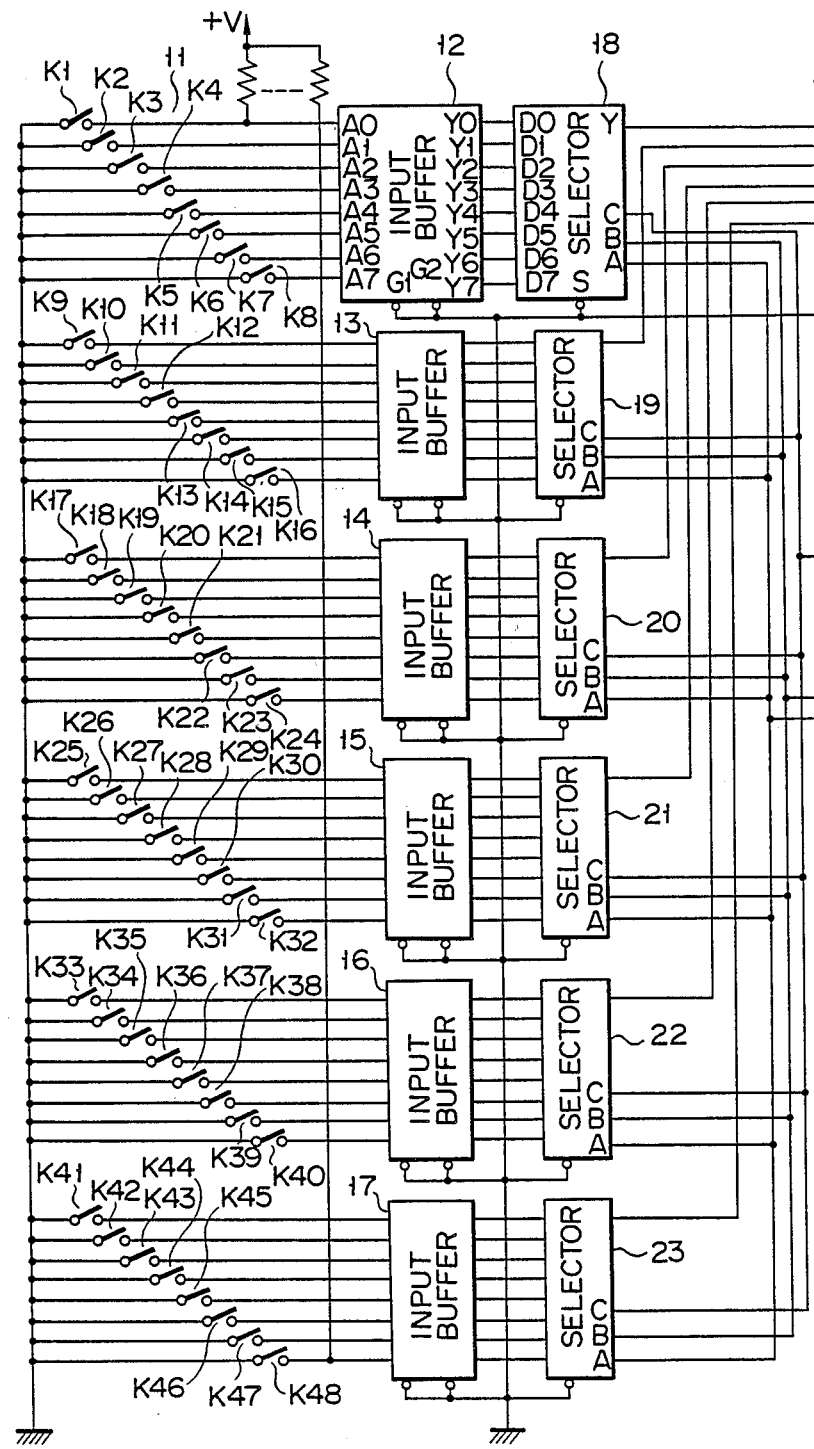

As is shown in FIGS. 1A and 1B, a key input circuit according to the invention comprises key contact section 11, Schmidt-type input buffers 12 to 17, selectors 18 to 24, counter circuit 25, and buffers 26 to 28. Key contact section 11 has 48 key switches, K1 to K48, which are arranged in six groups of eight switches. These six groups of switches are connected to input buffers 12 to 17, respectively. Hence, each input buffer can receive the contact signals from the eight key switches of the corresponding group, and can convert these signals to electrical signals. The outputs of input buffers 12 to 17 are coupled to the inputs of selectors 18 to 23, respectively. The outputs of selectors 18 to 23 are connected selector 24. Counter circuit 25 comprises counter 31 for lower four bits, and counter 32 for upper two bits. Buffers 26 to 28 are of the Schmidt type, and output three state-signals.

Each of input buffers 12 to 17 is, for example, SN74HC541. Each of selectors 18 to 24 is, for example, SN74HC151. Counter circuit 25 is, for instance, SN74HC393. Each of buffers 26 to 28 is, for example, SN74HC125.

Counters 31 and 32, forming counter circuit 25, are cleared by key-output enable signal KOE supplied from CPU 29 via buffer 27. CPU 29 can be provided in a keyboard, or in an information-processing apparatus to which the keyboard is connected. Counter 31 counts up key-scan clock signals KSC supplied from CPU 29 via buffer 28. The count value of counter 31 is supplied to selectors 18 to 24.

More specifically, key-scan clock signals KSC are supplied from CPU 29 via buffer 28 to count-input terminal CL of counter 31. The signal consisting of the lower three bits, which are output from output terminals QA, QB, and QC of counter 31, is supplied to select-signal input terminals A, B, and C of each of selectors 18 to 23. The signal of the upper bit, which is output from output terminal QD of counter 31, is supplied to select-signal input terminal A of selector 24. This upper-bit signal is also supplied to the count-input terminal CL of counter 32. The signals from output terminals QA and QB of counter 32 are supplied to select-signal input terminals B and C of selector 24, respectively.

The output signal of selector 24 is supplied as key-output signal KO to CPU 29 via output buffer 26. CPU 29 determines which key has been operated, in accordance with the number of key-scan clock signals KSC supplied with CPU 29 after the supply of key-output enable signal KOE, and also on the basis of the state of key-output signal KO supplied to CPU 29 from selector 24 via buffer 26. For instance, when key-output signal KO is at the logic "0" level at the trailing edge of the first key-output enable signal KOE, CPU 29 determines that key switch K1 has been turned on. When signal KO is at the logic "1" level at the trailing edge of the first key-output enable signal KOE, CPU 29 determines that key switch K1 is off. Likewise, when signal KO is at the logic "0" level at the time the first key-scan clock signal KSC is supplied, CPU 29 determines that key switch K2 has been turned on. When signal KO is at the logic "1" level at this time, CPU 29 determines that key switch K1 is off. In other words, when keyoutput signal KO is at the logic "0" level at the time the nth key-scan clock signal KSC is supplied, CPU 29 determines that the (n+1)th key switch has been turned on, and when signal KO is at the logic "1" level at this time, CPU 29 determines that the (n+1)th key switch has been turned off.

Input buffers 12 to 17, selectors 18 to 24, counter circuit 26, and buffers 26 to 28 can be a single gate array, such as 320-gate CMOS gate array μPD65005, manufactured by Nippon Electric Co., Ltd. Such a gate array is less expensive the conventionally used unit consisting of 48 diodes, a drive circuit and an input buffer, and occupies a much smaller space than the conventional unit. When the gate array is used in the key input circuit, and the key input circuit is incorporated into a keyboard, the resulting keyboard is inexpensive and simple in its structure.

Figure 2:
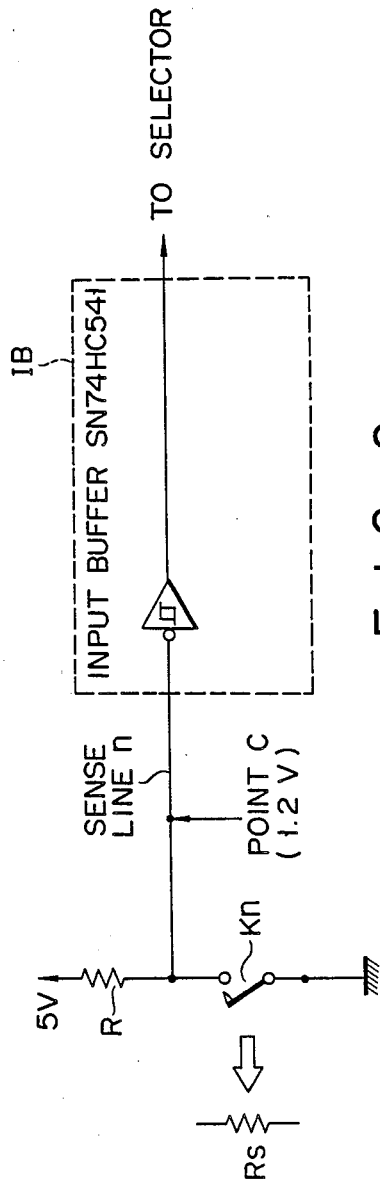
FIG. 2 is an equivalent circuit diagram showing each of the key switches used in the circuit of FIG. 1.

FIG. 2 is an equivalent circuit diagram of each key switch used in the key input circuit shown in FIGS. 1A and 1B. As is shown in FIG. 2, key switch Kn is connected, at one end, to the ground, and at the other end, to a power supply by resistor R. Sense line n extending to input buffer IB is coupled to the connection point (C) of key switch Kn and resistor R.

Since drive circuits and diodes are not used as in the conventional key input circuits, there is no influence of reference voltage $V_{OL}$ for the logic "0" of a drive circuit, or of forward voltage $V_F$ of a diode. Therefore, the margin of switch-on sense potential is 1.2 volts. This margin is 4.8 times larger than the margin (0.25 volts) possible with the conventional key input circuit.

In other words, the key input circuit of this invention is free of the influence of conditional changes, such as a high temperature, which would change $V_{OL}$ and $V_F$, and is not adversely influenced by the fact that $V_{OL}$ and $V_F$ are different from the design values. Hence, the key input circuit of the invention is considerably more reliable that the conventional type.

The maximum value, Rs(max), of contact resistance Rs, which is created when key switch Kn is depressed, can be given as follows:

$$\frac{Rs(\max)}{Rs(\max) + R} \times 5 = 1.2(V) \qquad (1)$$

Therefore:

$$Rs(\max) = 0.315R(\Omega) \qquad (2)$$

Comparing this maximum contact resistance Rs(mas) with that in the known key input circuit having diode, it will be clear that the key switches used in the key input circuit of the present invention have a useful life about five times longer than that of the key switches used in the known circuit, and can be turned on and off about 25,000,000 times, as may be understood from the following equation:

$$0.315R/0.065R = 4.8 \qquad (3).$$

Figure 3:
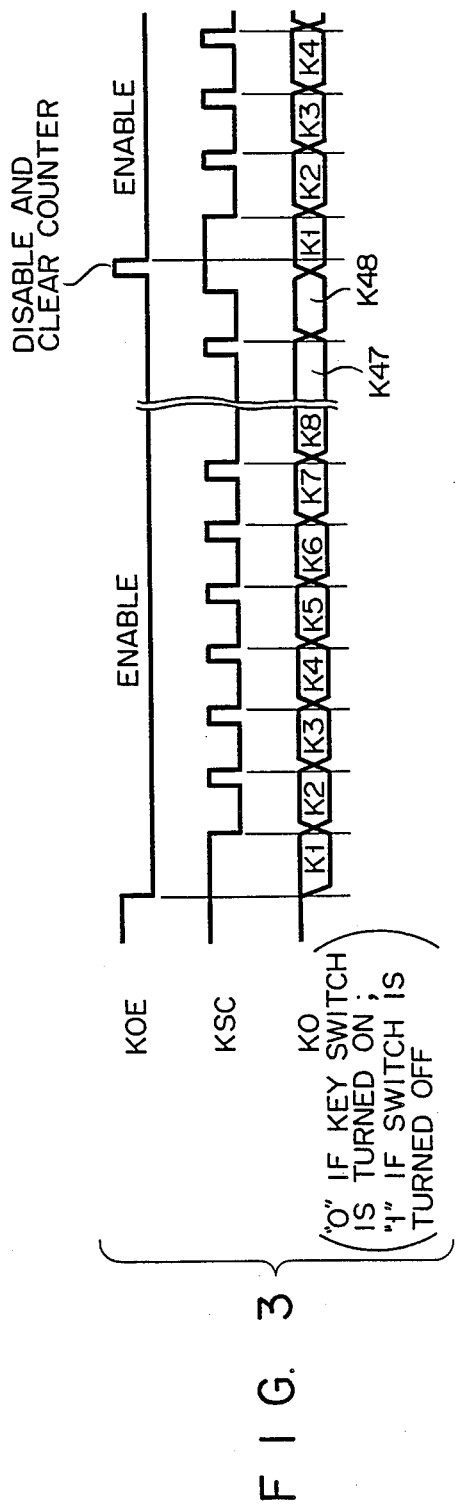
FIG. 3 is a timing chart explaining the operation of the circuit shown in FIG. 1.

The operation of the key input circuit shown in FIG. 1A and 1B will now be explained, with reference to the timing chart of FIG. 3.

As long as key-output enable signal KOE is at the logic "1" level, counters 31 and 32 are reset and unable to count the key-scan clock signals. Counters 31 and 32 become able to count the key-scan clock signals at the trailing edge of key-output enable signal KOE. At the same time, buffer 26 is enabled. Since counters 31 and 32 are still in the reset mode at this time, "0" signals are output from output terminals QA, QB, and QC of counter 31. These "0" signals are supplied to select-signal input terminals A, B, and C of each of selectors 18 to 23.

As a result, selectors 18 to 23 output the data supplied to their input terminals D0, to selector 24. More specifically, selector 18 outputs the signal supplied from key switch K1; selector 19 outputs the signal supplied from key switch K9; selector 20 outputs the signal output from key switch K17; selector 21 outputs the signal supplied from key switch K25; selector 22 outputs the signal output from key switch K33; and selector 23 outputs the signal output from key switch K41.

In the meantime, the "0" signals output from output terminal QD of counter 31, and the "0" signals output from output terminals QA and QB of counter 32 are supplied to select-signal input terminals A, B, and C of selector 24. Selector 24, therefore, supplies the signal output by key switch K1, as key-output signal KO, to CPU 29 via buffer 26.

Then, the first key-scan clock signal KSC is supplied via buffer 28 to counter 31. Counter 31 counts this signal KSC, and its count value increases from "0" to "1". Hence, a "1" signal is output from output terminal QA of counter 31. This "1" signal is supplied to select-signal input terminals A of selectors 18 to 23. Selectors 18 to 23, therefore, output the data input to their input terminals D1, to selector 24. More specifically, selector 18 outputs the signal supplied from key switch K2; selector 19 outputs the signal output from key switch K10; selector 20 outputs the signal supplied from key switch K18; selector 21 outputs the signal output from key switch K26; selector 22 outputs the signal output from key switch K34; and selector 23 outputs the signal supplied from key switch K42.

At this time, the "0" signals output by counters 31 and 32 are supplied to select-signal input terminals A, B, and C of selector 24. Therefore, selector 24 outputs the signal supplied from key switch K2 via selector 18, as key-output signal KO, to CPU 29 via buffer 26.

Thereafter, the second to seventh key-scan clock signals KSC are sequentially supplied via buffer 28 to counter 31. As counter 31 counts these signals KSC, its count value increases to "2", "3", "4", "5", and "7". Hence, "0", "1", and "0" signals, "1", "1", and "0" signals, "0", "0", and "1" signals, "1", "0", and "1" signals, "0", "1", and "1" signals, and "1", "1", and "1" signals are sequentially output from output terminals QA, QB, and QC of counter 31, and then to select-signal input terminals A, B, and C of selectors 18 to 23. As a result, selector 24 outputs the signals output by key switches K3 to K8 via selector 18, as key-output signals KO, to CPU 29 via buffer 26.

When the eighth key-scan clock signal KSC is supplied via buffer 28 to counter 31, counter 31 goes into a "count-up" state. Therefore, "0" signals are output from output terminals QA, QB, and QC of counter 31, and are supplied to select-signal input terminals A, B, and C of each of selectors 18 to 23. Hence, selectors 18 to 23 output the data supplied to their input terminals D0, to selection circuit 24.

At this time, a "1" signal is supplied to select-signal input terminal A of selector 24 from output terminal QD of counter 31, and "0" signals are supplied to select-signal input terminals B and C of selector 24 from output terminals QA and QB of counter 32. Selector 24, therefore, outputs the signal output by key switch K9, as key-output signal KO, to CPU 29 via buffer 26.

Thereafter, selector 24 outputs key-output signals KO to CPU 29 as CPU 29 outputs key-scan clock signals KSG, in the same way as described above.

When key switch K1 is turned on, CPU 29 detects this fact when key-output enable signal KOE falls to the logical "0" level before CPU 29 outputs the first key-scan clock signal KSC. In other words, when key switch (Kn+1) is turned on, CPU 29 detects this fact when key-output signal KO falls to the logic "0" level due to nth key-scan clock signal KSC. Since CPU 29 recognizes a key switch identified by the number of key-scan clock signals which CPU 29 has output, no ghost character signals will be generated even if other key switches have been operated simultaneously along with this key switch. The key input circuit of this invention can be said, therefore, to be highly reliable.

Figure 4:
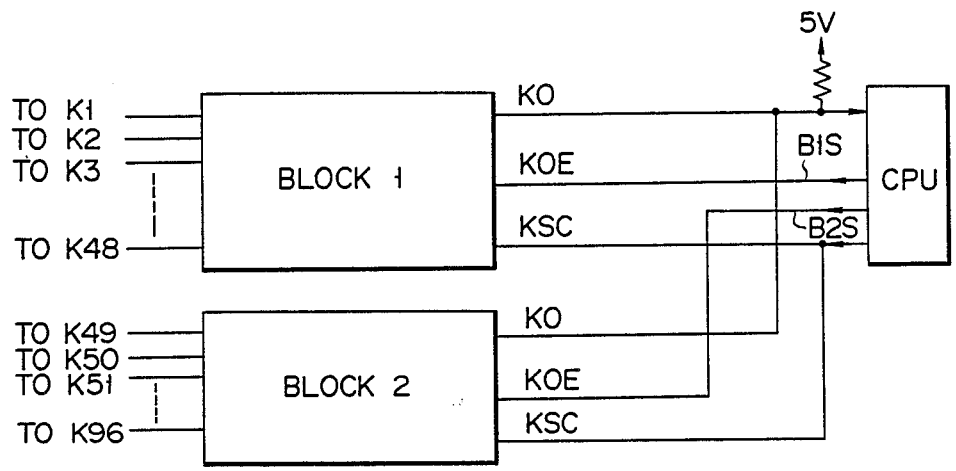
FIG. 4 is a diagram showing another embodiment of this invention.
Figure 5:
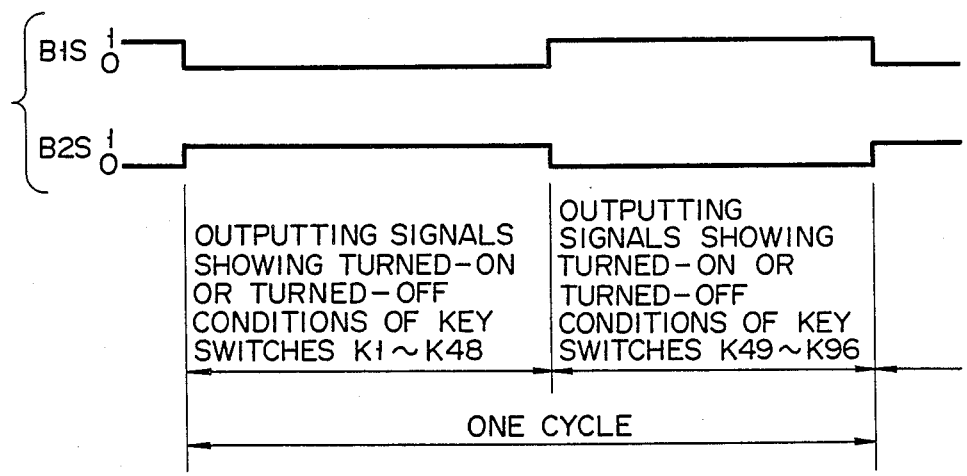
FIGS. 5 and 6 are timing charts explaining the operation of the circuit shown in FIG. 4.
Figure 6:
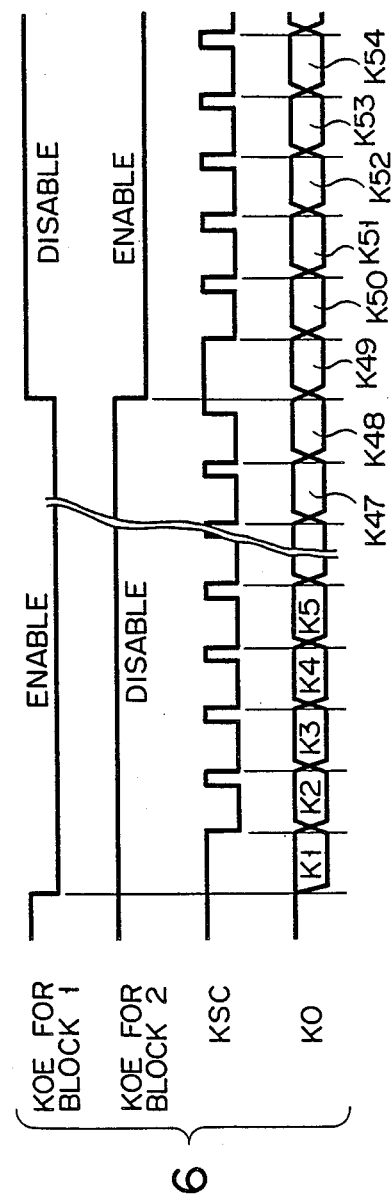

Two or more key input circuits identical to the one shown in FIGS. 1A and 1B can be combined, and are selected by supplying them individually key-output enable signals KOE. In this way, regardless of the number of key switches provided, it is possible to correctly identify which one of the key switches has been turned on, provided that the logic levels of keyoutput signals KO supplied from these input circuits are recognized. For example, when two circuits identical to the circuit shown in FIGS. 1A and 1B are combined as is illustrated in FIG. 4, a key input circuit can be formed which can identify any of 96 key switches that has been turned on. In this case, CPU 29 supplies block-selection signals B1S and B2S to blocks 1 and 2, both identical to the key input circuit of FIGS. 1A and 1B, and these signals B1S and B2s are also used as keyoutput enable signals KOE. As is shown in FIG. 5, the levels of block-selection signals B1S and B2S change in the opposite way. Therefore, the key input circuit of FIG. 4 operates in the manner set out in the timing chart of FIG. 6.

The key input circuit shown in FIGS. 1A and 1B is simple in structure, and is highly reliable. In addition, the key switches used in the circuit have a useful life about five times longer than that of the key switches of the conventional key input circuit. The useful life of the key switches can be extended by modifying the circuit shown in FIGS. 1A and 1B and FIG. 2. As has been described previously, the useful life of each key switch comes to an end when the potential (Vc) at the connection point (i.e., point C in FIG. 2) of the key switch and the resistor connecting the switch to the power supply rises above 1.2 volts. This is because the maximum voltage $V_{iL}(max)$ at which the input buffer can recognize logic "0" is 1.2 volts. It follows that if the circuit is modified such that the potential at the connection point of the key switch and the resistor cannot easily rise above 1.2 volts, the useful life of the key switch will be prolonged, even if contact resistance Rs of the switch gradually increases.

Figure 7:
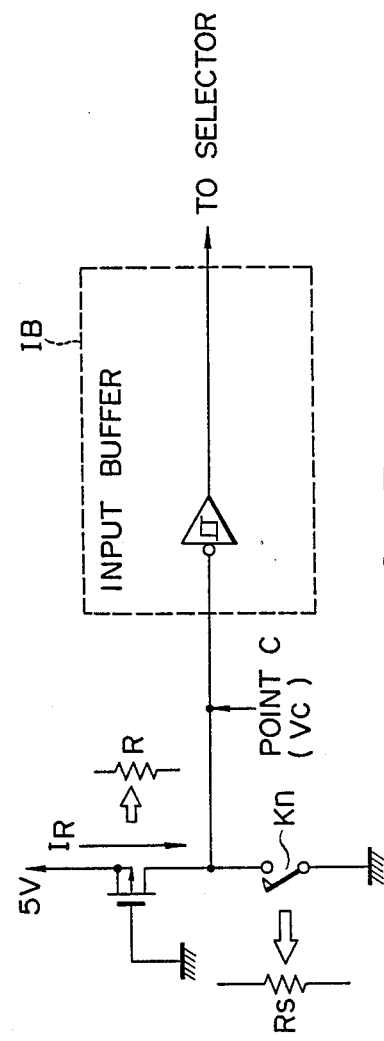
FIG. 7 is an equivalent circuit diagram showing each of the key switches used in still another embodiment of this invention.

FIG. 7 shows a circuit modified so as to enable the useful life of the key switch to be extended. In this circuit, a semiconductor element whose resistance increases in proportion to contact resistance Rs of key switch Kn, is used in place of resistor R having a fixed resistance and used in the circuit of FIG. 2. More precisely, a P-channel field-effect transistor (FET), used as a load element, is connected between key switch Kn and the power supply. This FET has the electrical characteristic represented in FIG. 8. As can be understood from FIG. 8, load resistance R of the FET increases exponentially after the potential at point C reaches a predetermined value (in this case, 1 volt). Hence, as can be seen from equation (2), maximum value Rs(max) of contact resistance Rs of key switch Kn also increases. In other words, key switch Kn can be used until its contact resistance Rs increases to this greater maximum value Rs(max). The load semiconductor element is not limited to an FET; it can, for instance, be another transistor element. Further, like input buffer IB, the FET or the another transistor element can be incorporated in an integrated circuit, such as a gate array or a custom IC.

In order to extend further the useful life of each key switch, the circuit can be modified such that the input potential of the input buffer does not rise above 1.2 volts, even if the potential at the connection point of the key switch and the resistance rises above 1.2 volts. FIG. 9 shows a circuit so modified. As is shown in this figure, the potential at connection point (point C) of key switch Kn and resistor R having a fixed resistance is applied to the positive input terminal of comparator CP. Reference potential $V_{TH}$ determined by resistors R1 and R2 is applied to the negative input terminal of comparator CP. Potential $V_{IN}$ at the output terminal of comparator CP is applied to the input terminal of input buffer IB.

In the circuit shown in FIG. 9, resistors R1 and R2 have resistances such that reference potential $V_{TH}$ is higher than 1.2 volts. Therefore, the output potential of comparator CP is at the logic "0" level even if potential Vc at point C is more than 1.2 volts, provided reference potential $V_{TH}$ is higher than potential Vc. Hence, input buffer IB can recognize logic "0" even if contact resistance Rs increases, thus raising potential Vc above 1.2 volts. Therefore, key switch Kn can be used continuously, even after its contact resistance Rs rises to higher than the maximum value, Rs(max), for the circuit shown in FIG. 2, resulting in an increase in the useful life of key switch Kn. Like input buffer IB, comparator CP can be incorporated in an integrated circuit such as a gate array or a custom IC.

What is claimed is:

1. A key input circuit for use in a keyboard, comprising:
   a plurality of key switches;
   a plurality of signal-output means connected to said key switches, for outputting electrical signals when said key switches are turned on, each of said signal-output means including resistor means connected to a corresponding key switch and a power supply, and input buffer means coupled to a connection point of said resistor means and said key switch, a resistance of said resistor means increasing in correspondence with increments of a contact resistance of said key switch;
   counter means for receiving and counting clock signals supplied at predetermined intervals;
   scanning means for receiving output data from said counter means and scanning said signal-output means in accordance with output data of said counter means, thereby to output said electrical signals;
   determining means for generating said clock signals, receiving the electrical signal from said scanning means, and determining which key switch has been turned on, in accordance with how many clock signals has been generated before the electrical signal is received; and
   reset means for resetting said counter means at a desired time.

2. The key input circuit according to claim 1, wherein said scanning means includes a plurality of first selector means, one coupled to some of said signal-output means, each first selector means selecting one of said signal-output means in accordance with the output data of said counter means, thereby to output the electrical signal supplied from a selected signal-output means, and second selector means, coupled to said plurality of first selector means, for selecting one of said first selector means in accordance with the output data of said counter means, thereby to output the electrical signal supplied from the first selector means selected by said second selector means.

3. The key input circuit according to claim 2, wherein said counter means includes a multi-bit counter, said first selector means receive the data defined by lower bits of the counter, and select and output one of the output electrical signals of said signal-output means, which corresponds to the data defined by the lower bits, and said second selector means receives the data defined by upper bits of the counter, and selects and outputs one of the output electrical signals of said first selector means, which corresponds to the data defined by the upper bits.

4. The key input circuit according to claim 3, wherein each of said first selector means is connected to eight signal-output means, for selecting one of the output electrical signals of the eight signal-output means, which corresponds to the data defined by three lower bits of said counter.

5. The key input circuit according to claim 4, wherein said scanning means includes six first selector means, said counter is a six-bit counter, and said second selector means is connected to the six first selector means, for outputting one of the output electric signals of said first selector means, which corresponds to the data defined by three upper bits of said six-bit counter.

6. The key input circuit according to claim 5, wherein said signal-output means, said counter, and said scanning means are formed of a single gate array.

7. The key input circuit according to claim 5, further comprising a plurality of said counters and a plurality of said scanning means.

8. The key input circuit according to claim 7, wherein said signal-output means, said counters, and said scanning means are formed of a single gate array.

9. The key input circuit according to claim 1, wherein said reset means includes means for supplying to said counter means a reset signal for resetting said counter means, when said scanning means has scanned desired key switches of said plurality of key switches.

10. The key input circuit according to claim 1, wherein said resistor means includes a semiconductor element.

11. The key input circuit according to claim 10, wherein said semiconductor element includes a field-effect transistor.

12. The key input circuit according to claim 11, wherein said signal-output means, said counter, and said scanning means are formed of a single gate array.

13. The key input circuit according to claim 1, wherein each of said signal-output means further includes potential-applying means connected between said connection point and an input terminal of said input buffer means, for applying a potential to the input terminal of said input buffer means, said potential being not more than a predetermined potential, even if the potential at said connection point rises above the predetermined potential due to an increase in a contact resistance of said key switch when said key switch is closed.

14. The key input circuit according to claim 13, wherein said potential-applying means applies said predetermined potential to the input terminal of said input buffer means until the potential at said connection point rises above a desired potential higher than said predetermined potential.

15. The key input circuit according to claim 14, wherein said potential-applying means is comparator means for comparing the potential at said connection point with said desired potential.

16. The key input circuit according to claim 15, wherein said signal-output means, said counter, and said scanning means are formed of a single custom IC.

17. The key input circuit according to claim 16, wherein said comparator means is connected to said potential-applying means, for receiving said desired potential to be compared with the potential at said connection point, and said potential-applying means is provided outside said custom IC.

* * * * *